US012597706B2

(12) United States Patent
Chen et al.

(10) Patent No.: US 12,597,706 B2
(45) Date of Patent: Apr. 7, 2026

(54) ELECTRONIC DEVICE ANTENNA PACKAGE WITH MULTIPLE ANTENNAS

(71) Applicant: Advanced Semiconductor Engineering, Inc., Kaohsiung (TW)

(72) Inventors: Jenchun Chen, Kaohsiung (TW); Shyue-Long Louh, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 17/716,922

(22) Filed: Apr. 8, 2022

(65) Prior Publication Data

US 2023/0327336 A1      Oct. 12, 2023

(51) Int. Cl.
| | |
|---|---|
| *H01Q 5/307* | (2015.01) |
| *H01L 23/31* | (2006.01) |
| *H01L 23/66* | (2006.01) |
| *H01Q 1/22* | (2006.01) |
| *H01Q 5/42* | (2015.01) |

(52) U.S. Cl.
CPC ............. *H01Q 5/307* (2015.01); *H01L 23/31* (2013.01); *H01L 23/66* (2013.01); *H01Q 1/2283* (2013.01); *H01Q 5/42* (2015.01)

(58) Field of Classification Search
CPC ........ H01Q 5/307; H01Q 1/2283; H01Q 5/42; H01Q 25/005; H01L 23/31; H01L 23/66; H01L 25/18; H01L 2223/6605; H01L 2223/6677
See application file for complete search history.

(56) References Cited

U.S. PATENT DOCUMENTS

| | | | |
|---|---|---|---|
| 6,815,739 | B2 | 11/2004 | Huff et al. |
| 7,830,312 | B2 | 11/2010 | Choudhury et al. |
| 8,278,749 | B2 | 10/2012 | Lachner et al. |
| 8,901,688 | B2 | 12/2014 | Kamgaing |
| 9,620,464 | B2 | 4/2017 | Baks et al. |
| 9,917,372 | B2 | 3/2018 | Tong et al. |
| 9,923,279 | B2 | 3/2018 | Lipowski et al. |
| 10,103,447 | B2 | 10/2018 | Tong et al. |
| 10,263,346 | B2 | 4/2019 | Kamgaing et al. |
| 10,756,033 | B2 | 8/2020 | Dalmia et al. |
| 10,971,825 | B2 | 4/2021 | Kang et al. |
| 10,978,434 | B2 | 4/2021 | Cheah et al. |
| 11,024,981 | B2 | 6/2021 | Chiang et al. |
| 11,115,510 | B1 | 9/2021 | Abdul-Gaffoor et al. |
| 11,404,788 | B1 | 8/2022 | Wang et al. |
| 11,411,315 | B2 | 8/2022 | Onaka et al. |
| 11,710,908 | B2 | 7/2023 | Cao et al. |

(Continued)

OTHER PUBLICATIONS

U.S. Appl. No. 17/676,086, filed Feb. 18, 2022, Chen et al.

(Continued)

*Primary Examiner* — Dameon E Levi
*Assistant Examiner* — Yonchan J Kim
(74) *Attorney, Agent, or Firm* — Foley & Lardner LLP

(57) ABSTRACT

An electronic device is disclosed. The electronic device includes a carrier and a first interposer disposed on the carrier. The first interposer has a first region configured for providing an external electrical connection to outside the electronic device and a second region distinct from the first region. The electronic device also includes a first antenna component disposed on the second region of the first interposer.

20 Claims, 15 Drawing Sheets

1

(56)        References Cited

U.S. PATENT DOCUMENTS

| | | | |
|---|---|---|---|
| 11,756,902 B2 | 9/2023 | Ueda | |
| 11,936,123 B2 | 3/2024 | Arai | |
| 2016/0308287 A1* | 10/2016 | Kamgaing | H01Q 25/00 |
| 2017/0237154 A1 | 8/2017 | Choudhury et al. | |
| 2018/0102353 A1* | 4/2018 | Pagani | H01L 24/06 |
| 2019/0096828 A1* | 3/2019 | Wu | H01L 23/5384 |
| 2019/0139915 A1* | 5/2019 | Dalmia | H01L 23/552 |
| 2019/0288382 A1 | 9/2019 | Kamgaing et al. | |
| 2019/0372198 A1* | 12/2019 | Dalmia | H01Q 1/2283 |
| 2019/0379139 A1* | 12/2019 | Takizawa | H01Q 1/526 |
| 2020/0153110 A1* | 5/2020 | Kim | H01Q 21/065 |
| 2020/0212537 A1* | 7/2020 | Chuang | H01Q 19/10 |
| 2020/0365971 A1* | 11/2020 | Moallem | H01Q 13/06 |
| 2021/0183775 A1* | 6/2021 | Lim | H01L 25/0657 |
| 2022/0157746 A1* | 5/2022 | Ho | H01Q 21/065 |
| 2022/0247089 A1* | 8/2022 | Hartner | H01P 5/107 |
| 2023/0299461 A1 | 9/2023 | Takasugi et al. | |

OTHER PUBLICATIONS

Non-Final Office Action for U.S. Appl. No. 17/676,086, issued May 28, 2024, 13 pages.
Final Office Action for U.S. Appl. No. 17/676,086, issued Sep. 11, 2024, 11 pages.

* cited by examiner

ELECTRONIC DEVICE ANTENNA PACKAGE WITH MULTIPLE ANTENNAS

BACKGROUND

1. Field of the Disclosure

The present disclosure generally relates to an electronic device.

2. Description of the Related Art

To reduce the size and achieve a higher integration of semiconductor device packages, several packaging solutions, such as Antenna in Package (AiP) and Antenna on Package (AoP), have been developed and implemented.

However, to support the industry's demand for increased electronic functionality, the size and/or form factor of the semiconductor device packages will inevitably be increased, and some applications may be limited (e.g., in portable devices).

SUMMARY

Embodiments of the present disclosure provide an electronic device. The electronic device includes a carrier and a first interposer disposed on the carrier. The first interposer has a first region configured for providing an external electrical connection to outside the electronic device and a second region distinct from the first region. The electronic device also includes a first antenna component disposed on the second region of the first interposer.

Embodiments of the present disclosure provide an electronic device. The electronic device includes a first antenna component and a second antenna component disposed over the first antenna component. The electronic device also includes a first electronic component disposed between the first antenna component and the second antenna component. The electronic device also includes a second electronic component disposed between the first antenna component and the second antenna component. The first electronic component and the second electronic component are non-overlapped in a cross-section view.

Embodiments of the present disclosure provide an electronic device. The electronic device includes a carrier and an interposer disposed on the carrier. The interposer has a first surface and a lateral surface distinct from the first surface. The electronic device also includes a first antenna component disposed on the first surface of the interposer and a second antenna component disposed on the lateral surface of the interposer.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1A:
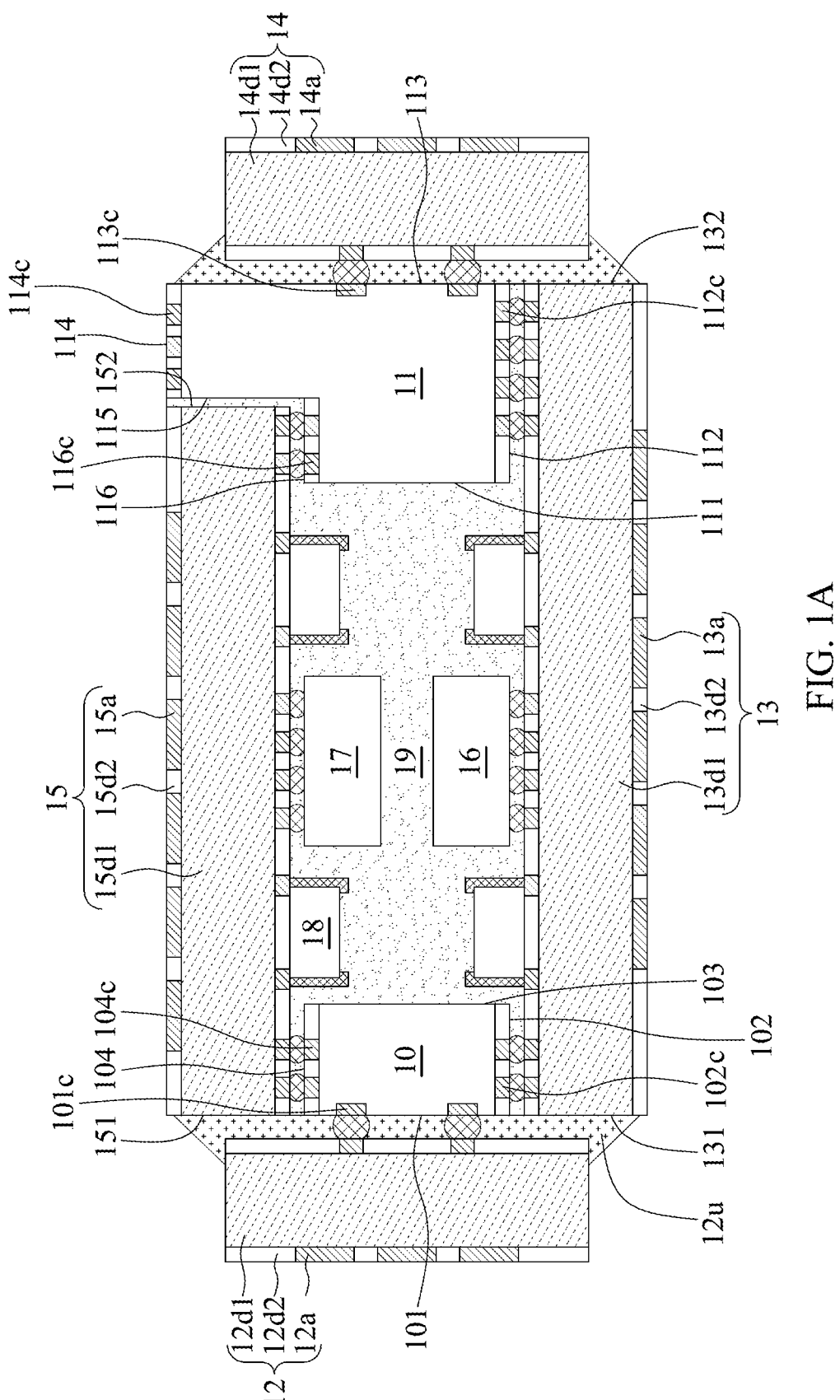
FIG. 1A is a cross-sectional view of an electronic device, in accordance with an embodiment of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1A is a cross-sectional view of an electronic device 1, in accordance with an embodiment of the present disclosure. Referring to FIG. 1A, the electronic device 1 includes connectors 10, 11, antenna components 12, 13, 14, 15, electronic components 16, 17, 18, and an encapsulant 19.

In some embodiments, the electronic device 1 may be or include a system-in-package (SiP). In some embodiments, the electronic device 1 may be or include an antenna device or an antenna package. In some embodiments, the electronic device 1 may be or include a wireless device, such as a user equipment (UE), a mobile station, a mobile device, an apparatus communicating with the Internet of Things (IoT), etc.

In some embodiments, the connectors 10 and 11 (or supporting elements) may each be or include a substrate or an interposer. The connectors 10 and 11 may each be or include, for example, silicon (Si), glass or other suitable material. In some embodiments, the connectors 10 and 11 may each be or include a printed circuit board, such as a paper-based copper foil laminate, a composite copper foil laminate, or a polymer-impregnated glass-fiber-based copper foil laminate.

The connector 10 may have surfaces 101, 102, 103, and 104. The surfaces 101, 102, 103, and 104 may be distinct from one another. In some embodiments, the surfaces of the connector 10 may also be referred to as regions of the connector 10. The surface 101 may be opposite to the surface 103 and the surface 102 may be opposite to the surface 104. The surface 102 and the surface 104 may each extend between the surface 101 and the surface 103. The surface 102 and the surface 104 may each be connected with the surface 101 and the surface 103.

The surface 101 may be covered by the antenna component 12. The surface 102 may be covered by the antenna component 13. The surface 104 may be covered by the antenna component 15. The connector 10 may be disposed between the antenna component 13 and the antenna component 15. The connector 10, the antenna component 13 and the antenna component 15 may be overlapping in a direction substantially perpendicular to the surface 102 and/or the surface 104.

In some embodiments, the surface 101 and the surface 103 may be substantially parallel. The surface 102 and the surface 104 may be substantially parallel.

In some embodiments, the surface 102 and the surface 104 may each be non-coplanar to the surface 101 and/or the surface 103. For example, the surface 102 and the surface 104 may each be non-parallel to the surface 101 and/or the surface 103. For example, the surface 102 and the surface 104 may each be substantially perpendicular to the surface 101 and/or the surface 103.

In some embodiments, the connector 10 may include one or more conductive elements (e.g., conductive pads) 101c, 102c, and 104c in proximity to, adjacent to, or embedded in and exposed at the surfaces 101, 102, and 104. The connector 10 may include a solder resist on the surfaces 101, 101, 102, and 104 to fully expose or to expose at least a portion of the conductive elements 101c, 102c, and 104c for electrical connections.

The conductive elements 101c, 102c, and 104c may be configured to provide an external connection for the electronic device 1. For example, the conductive element 101c may be electrically connected with the antenna component 12. The conductive element 102c may be electrically connected with the antenna component 13. The conductive element 104c may be electrically connected with the antenna component 15. The antenna components 12, 13, and 15 may be electrically connected with one another through the connector 10.

In some embodiments, the connector 10 and the connector 11 may include different shapes (such as geometric shapes), different areas or different contours from a cross-sectional view. The connector 11 may have surfaces 111, 112, 113, 114, 115, and 116. The surfaces 111, 112, 113, 114, 115, and 116 may be distinct from one another. In some embodiments, the surfaces of the connector 11 may also be referred to as regions of the connector 11. The surface 113 may be opposite to the surface 111 and/or the surface 115. The surface 112 may be opposite to the surface 114 and/or the surface 116.

The surface 112 may extend between (or be connected with) the surface 111 and the surface 113. The surface 116 may extend between (or be connected with) the surface 111 and the surface 115. The surface 115 may extend between (or be connected with) the surface 114 and the surface 116. The surface 114 may extend between (or be connected with) the surface 113 and the surface 115.

The surface 112 may be covered by the antenna component 13. The surface 113 may be covered by the antenna component 14. The surface 116 may be covered by the antenna component 15. The connector 11 may be disposed between the antenna component 13 and the antenna component 15. The connector 11, the antenna component 13 and the antenna component 15 may be overlapping in a direction substantially perpendicular to the surface 112 and/or the surface 116.

The antenna component 14 and the antenna component 15 may be overlapping in a direction substantially parallel to the surface 112, the surface 114 and/or the surface 116. The antenna component 14 and the antenna component 15 may be non-overlapping in a direction substantially parallel to the surface 111, the surface 113 and/or the surface 115.

In some embodiments, the surfaces 111, 113, and 115 may be substantially parallel. The surfaces 112, 114, and 116 may be substantially parallel.

In some embodiments, the surfaces 111, 113, and 115 may each be non-coplanar to the surfaces 112, 114, and/or 116. For example, the surfaces 111, 113, and 115 may each be non-parallel to the surfaces 112, 114, and/or 116. For example, the surfaces 111, 113, and 115 may each be substantially perpendicular to the surfaces 112, 114, and/or 116.

An elevation of the surface 116 may be different from an elevation of the surface 114. The surface 116 may be recessed with respect to the surface 114. The surface 114 may protrude with respect to the surface 116. The surface 114 may be disconnected from the surface 116. The surface 115 may be recessed with respect to the surface 111. The surface 111 may protrude with respect to the surface 115. The surface 111 may be disconnected from the surface 115. The surfaces 111, 115, and 116 may define a stepped structure. The surface 115 and the surface 116 may define a corner.

In some embodiments, the connector 11 may include one or more conductive elements (e.g., conductive pads) 112c, 113c, 114c, and 116c in proximity to, adjacent to, or embedded in and exposed at the surfaces 112, 113, 114, and 116. The connector 10 may include a solder resist on the surfaces 112, 113, 114, and 116 to fully expose or to expose at least a portion of the conductive elements 112c, 113c, 114c, and 116c for electrical connections.

The conductive elements 112c, 113c, 114c, and 116c may be configured to provide an external connection for the electronic device 1. For example, the conductive element 112c may be electrically connected with the antenna component 13. The conductive element 113c may be electrically connected with the antenna component 14. The conductive element 116c may be electrically connected with the antenna component 15. The antenna components 13, 14, and 15 may be electrically connected with one another through the connector 11.

In some embodiments, the antenna components 12, 13, 14 and 15 may be electrically connected with one another through the connectors 10 and 11.

The conductive elements 114c may provide electrical connections between the electronic device 1 and external components (e.g., external circuits or circuit boards). In some embodiments, the conductive elements 114c may be exposed from the electronic device 1.

The antenna component 12 may be supported by the connector 10. The antenna component 12 may be disposed on the surface 101 of the connector 10. The antenna component 12 may include a conductive layer 12a, a carrier 12d1 and a protection layer 12d2.

The conductive layer 12a may be disposed on the carrier 12d1. The conductive layer 12a may be exposed from the protection layer 12d2. In some other embodiments, the conductive layer 12a may be partially covered by the protection layer 12d2.

The conductive layer 12a may be configured to radiate and/or receive electromagnetic signals, such as radio frequency (RF) signals. The conductive layer 12a may include an antenna array or an antenna pattern. For example, the conductive layer 12a may include a plurality of antennas (or antenna elements). The conductive layer 12a may be of any suitable type, such as patch antennas, slot-coupled antennas, stacked patches, dipoles, monopoles, etc., and may have different orientations and/or polarizations.

In some embodiments, the conductive layer 12a may include a conductive material such as a metal or metal alloy. Examples of the conductive material include gold (Au), silver (Ag), copper (Cu), platinum (Pt), Palladium (Pd), other metal(s) or alloy(s), or a combination of two or more thereof. In some embodiments, the carrier 12d1 may be a substrate, such as a ceramic substrate, a semiconductor substrate, a dielectric substrate, a glass substrate, etc. In some embodiments, the protection layer 12d2 may include pre-impregnated composite fibers (e.g., pre-preg), Borophosphosilicate Glass (BPSG), silicon oxide, silicon nitride, silicon oxynitride, Undoped Silicate Glass (USG), any combination thereof, or the like. Examples of a pre-preg may include, but are not limited to, a multi-layer structure formed by stacking or laminating a number of pre-impregnated materials/sheets.

The antenna component 13 may be supported by the connectors 10 and 11. The antenna component 13 may be disposed on the surface 102 of the connector 10 and the surface 112 of the connector 11. In some embodiments, a surface 131 of the antenna component 13 may be substantially coplanar with the surface 101 of the connector 10. In some embodiments, a surface 132 of the antenna component 13 may be substantially coplanar with the surface 113 of the connector 11.

The antenna component 13 may include a conductive layer 13a, a carrier 13d1 and a protection layer 13d2. The conductive layer 13a, the carrier 13d1 and the protection layer 13d2 may be similar to the conductive layer 12a, the carrier 12d1 and the protection layer 12d2.

The antenna component 14 may be supported by the connector 11. The antenna component 14 may be disposed on the surface 113 of the connector 11. The antenna component 14 may include a conductive layer 14a, a carrier 14d1 and a protection layer 14d2. The conductive layer 14a, the carrier 14d1 and the protection layer 14d2 may be similar to the conductive layer 12a, the carrier 12d1 and the protection layer 12d2.

The antenna component 15 may be supported by the connectors 10 and 11. The antenna component 15 may be disposed on the surface 104 of the connector 10 and the surface 116 of the connector 11. In some embodiments, a surface 151 of the antenna component 15 may be substantially coplanar with the surface 101 of the connector 10. The antenna component 15 may be spaced apart from the surface 115 of the connector 11. For example, a surface 152 of the antenna component 15 may be spaced apart from the surface 115 of the connector 11. For example, the antenna component 15 may not contact the surface 115 of the connector 11.

The antenna component 15 may include a conductive layer 15a, a carrier 15d1 and a protection layer 15d2. The conductive layer 15a, the carrier 15d1 and the protection layer 15d2 may be similar to the conductive layer 12a, the carrier 12d1 and the protection layer 12d2.

In some embodiments, one or more of the carriers 12d1, 13d1, 14d1 and 15d1 may be omitted. For example, the conductive layer 12a may be directly formed on the connector 10. The conductive layer 13a may be directly formed on the connector 10 and/or the connector 11. For example, the conductive layer 14a may be directly formed on the connector 11. The conductive layer 15a may be directly formed on the connector 10 and/or the connector 11.

In some embodiments, an area of the antenna component 13 may be greater than an area of the antenna component 15. In some embodiments, a width (e.g., a distance between the surfaces 131 and 132) of the antenna component 13 may be greater than a width (e.g., a distance between the surfaces 151 and 152) of the antenna component 15.

In some embodiments, the antenna component 13 and the antenna component 15 may define the longer sides of the electronic device 1. The antenna component 12 and the antenna component 14 may define the shorter sides of the electronic device 1.

In some embodiments, the antenna components 12, 13, 14 and 15 may each support fifth generation (5G) communications, such as Sub-6 GHz frequency bands and/or millimeter (mm) wave frequency bands. For example, the antenna components 12, 13, 14 and 15 may each be configured for transmission and reception using millimeter wave signals. In some embodiments, the antenna components 12, 13, 14 and 15 may support beyond-5G or 6G communications, such as tetrahertz (THz) frequency bands. In some embodiments, the antenna components 12, 13, 14 and 15 may each be a multiple-band antenna component.

In some embodiments, the antenna components 12, 13, 14 and 15 may have different frequencies (or operating frequencies) or bandwidths (or operating bandwidths).

In some embodiments, a smaller antenna component may have a higher frequency. For example, the antenna components 12 and 14 may be higher-band antenna components. For example, the antenna component 12 may have a frequency higher than a frequency of the antenna component 13. For example, the antenna component 12 may have a frequency higher than a frequency of the antenna component 15. For example, the antenna component 14 may have a frequency higher than a frequency of the antenna component 13. For example, the antenna component 14 may have a frequency higher than a frequency of the antenna component 15.

For example, the antenna component 15 may have a frequency higher than a frequency of the antenna component 13.

In some embodiments, the antenna components 12, 13, 14 and 15 may each be electrically connected to the connectors 10 and 11 by way of flip-chip, wire-bond techniques, metal to metal bonding (such as Cu to Cu bonding), or hybrid bonding.

For example, the antenna component 12 may be electrically connected to the connector 10 by one or more conductive elements, such as controlled collapse chip connection (C4) bumps, a ball grid array (BGA) or a land grid array (LGA). In some embodiments, an underfill 12u may be disposed between the antenna component 12 and the connector 10 to cover the conductive elements. The underfill 12u may partially cover the antenna components 13 and 15. However, in other embodiments, the underfill 12u may be omitted.

The connector 10 may be disposed between the antenna components 13 and 15. The connector 10 may be disposed between the antenna components 12 and 14. A portion of the connector 11 may be disposed between the antenna components 13 and 15. A portion of the connector 11 may extend along the surface 152 of the antenna component 15.

The electronic component 16 may be disposed on the antenna component 13. The electronic components 17 and 18 may be disposed on the antenna component 15. The electronic components 16, 17 and 18 may be disposed between the antenna component 13 and the antenna component 15. At least two of the electronic components 16, 17 and 18 may be overlapping from a cross-sectional view. For example, the electronic components 16 and 17 are overlapping in FIG. 1A. At least two of the electronic components 16, 17 and 18 may be non-overlapping from a cross-sectional view. For example, the electronic components 16 and 18 are non-overlapping in FIG. 1A. For example, the electronic component 16 may be laterally spaced apart from the electronic component 18.

The electronic components 16, 17 and 18 may each be electrically connected to one or more other electrical components (if any) and to the antenna components 13 and 15, and the electrical connection may be attained by way of flip-chip, wire-bond techniques, metal to metal bonding (such as Cu to Cu bonding), or hybrid bonding.

The electronic components 16, 17 and 18 may each be electrically connected with the antenna components 12, 13, 14 and 15 through the connectors 10 and 11.

In some embodiments, the electronic component 18 may include a passive device such as a resistor, a capacitor, an inductor, or a combination thereof. In some embodiments, the electronic components 16 and 17 may each be a chip or a die including a semiconductor substrate, one or more integrated circuit (IC) devices and one or more overlying interconnection structures therein. The IC devices may include active devices such as transistors and/or passive devices such as resistors, capacitors, inductors, or a combination thereof. For example, the electronic components 16 and 17 may each include a system on chip (SoC). For example, the electronic components 16 and 17 may each include a radio frequency integrated circuit (RFIC), an application-specific IC (ASIC), a central processing unit (CPU), a microprocessor unit (MPU), a graphics processing unit (GPU), a microcontroller unit (MCU), a field-programmable gate array (FPGA), or another type of IC.

Although there are six electronic components in FIG. 1A, the number of the electronic components is not limited thereto. In some embodiments, there may be any number of electronic components depending on design requirements.

The encapsulant 19 may be disposed between the antenna component 13 and the antenna component 15 to cover or encapsulate the electronic components 16, 17 and 18.

In some embodiments, the encapsulant 19 may include an epoxy resin having fillers, a molding compound (e.g., an epoxy molding compound or other molding compound), a polyimide, a phenolic compound or material, a material with a silicone dispersed therein, or a combination thereof.

According to some embodiments of the present disclosure, by using the connectors 10 and 11 to connect the antenna components 12, 13, 14 and 15, more antennas of different frequencies may be incorporated in the electronic device 1 without increasing the size and/or form factor of the electronic device 1. The radiation directions of the antenna components 12, 13, 14 and 15 may be different.

In addition, the conductive elements 114c of the connector 11 may provide electrical connections between the electronic device 1 and external components (e.g., external circuits or circuit boards), and thus an additional connector is not needed. Furthermore, the space defined by the connectors 10 and 11 may be used to accommodate the electronic components (including the electronic components 16, 17, 18).

Figure 1B:
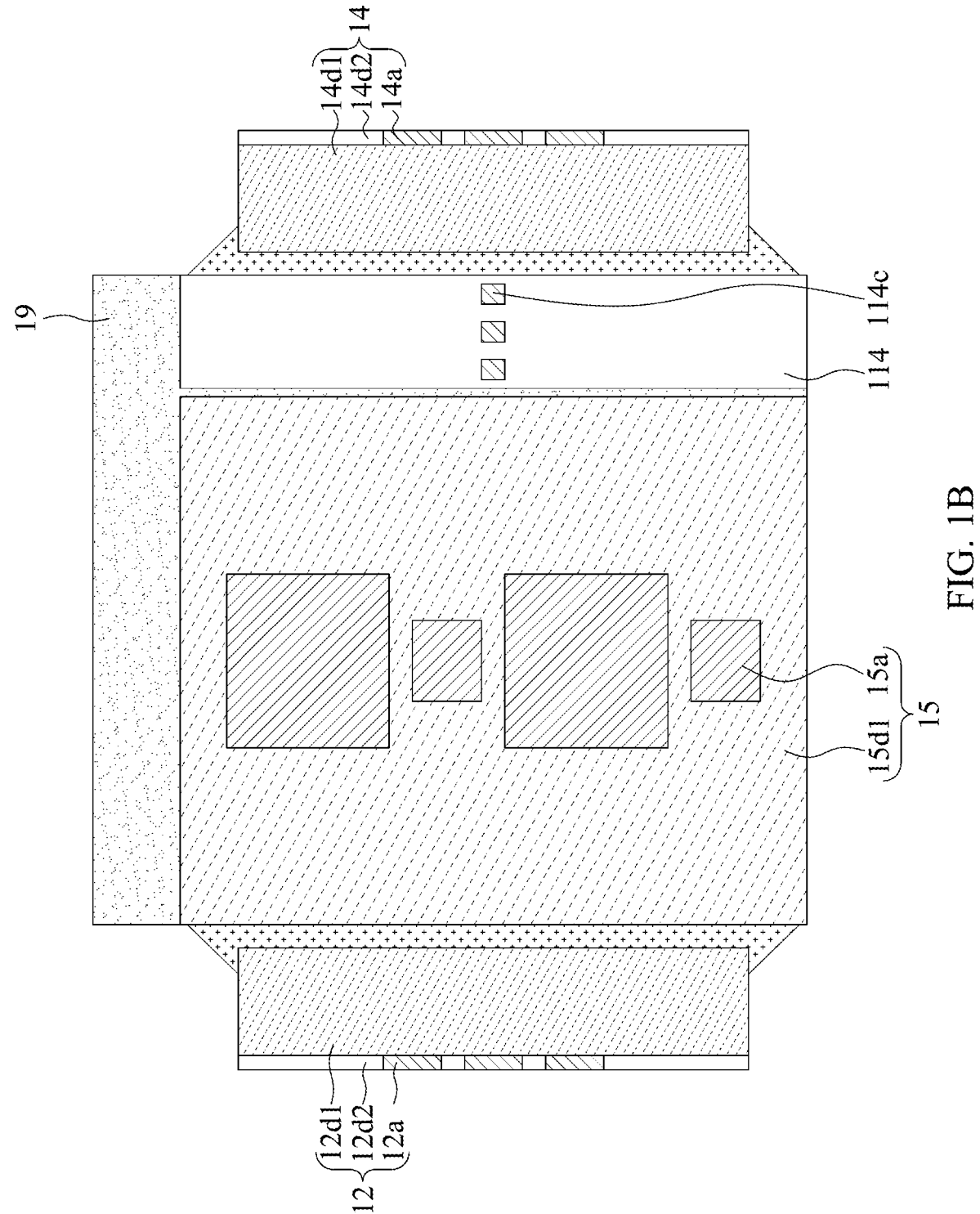
FIG. 1B is a cross-sectional view of a part of an electronic device, in accordance with an embodiment of the present disclosure.

FIG. 1B is a cross-sectional view of a part of the electronic device 1, in accordance with an embodiment of the present disclosure.

The conductive layer 15a may include a plurality of antennas (or antenna elements). The antennas may be disposed on a surface of the carrier 15d1. The size or the surface area of the antennas may be different. In some embodiments, the bigger antenna may have a lower frequency. In some embodiments, the bigger antennas and the smaller antennas may be arranged in a staggered manner. The antennas may be laterally spaced from each other.

The antenna component 15 may be spaced apart from the surface 115. The antenna component 15 and the surface 114 may be non-overlapping from a cross-sectional view of FIG. 1B.

Figure 1C:
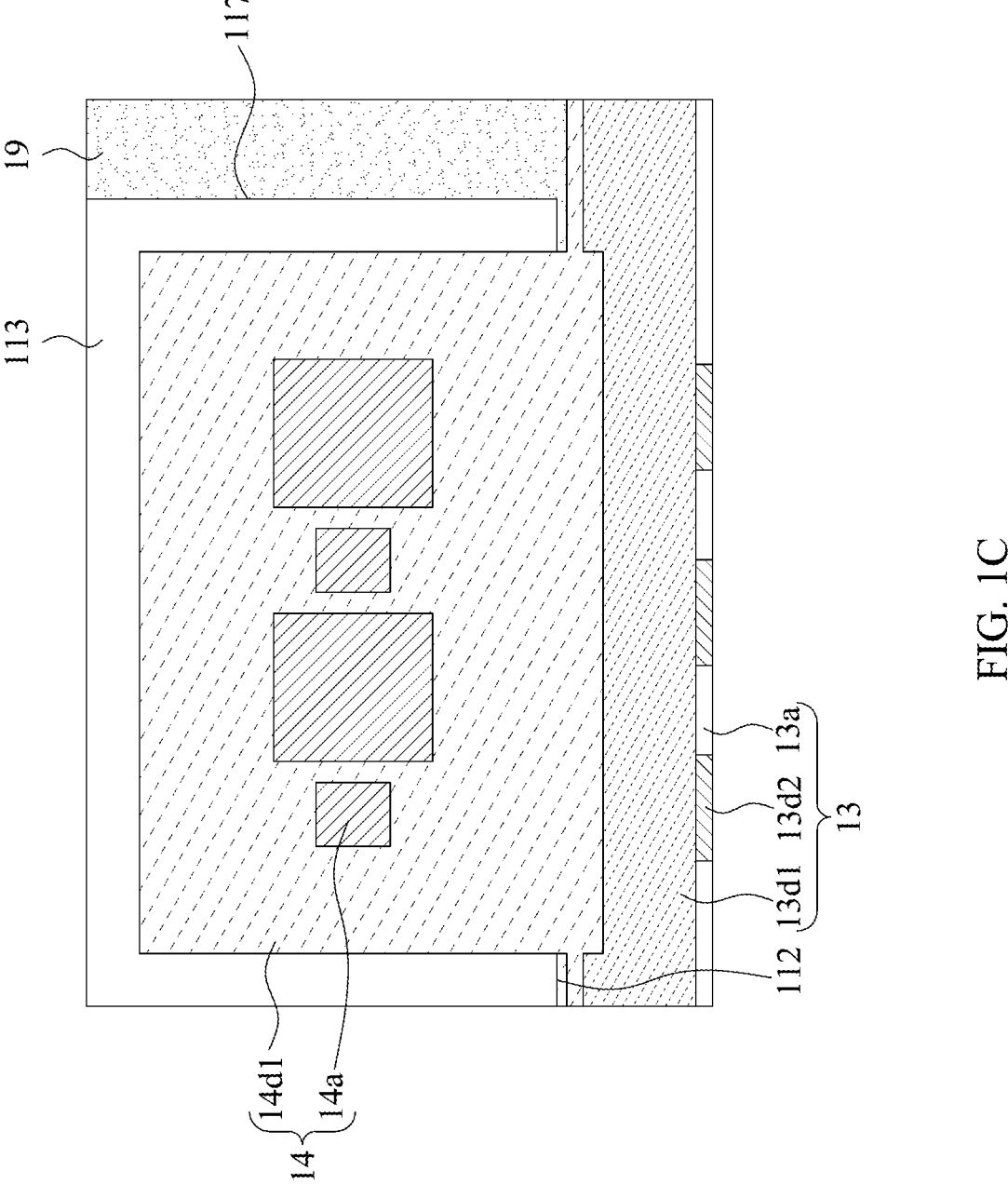
FIG. 1C is a cross-sectional view of a part of an electronic device, in accordance with an embodiment of the present disclosure.

FIG. 1C is a cross-sectional view of a part of the electronic device 1, in accordance with an embodiment of the present disclosure.

The connector 11 may have a surface 117. The surface 117 may extend between (or connected with) the surface 111 and the surface 113. The surface 117 may extend between (or be connected with) the surface 112 and the surface 114.

In some embodiments, the surface 117 may be non-coplanar to the surfaces 111, 112, 113, 114, 115, and/or 116. For example, the surface 117 may be non-parallel to the surfaces 111, 112, 113, 114, 115, and/or 116. For example, the surface 117 may be substantially perpendicular to the surfaces 111, 112, 113, 114, 115, and/or 116.

The carrier 14d1 of the antenna component 14 does not extend out of the surface 117.

Figure 1D:
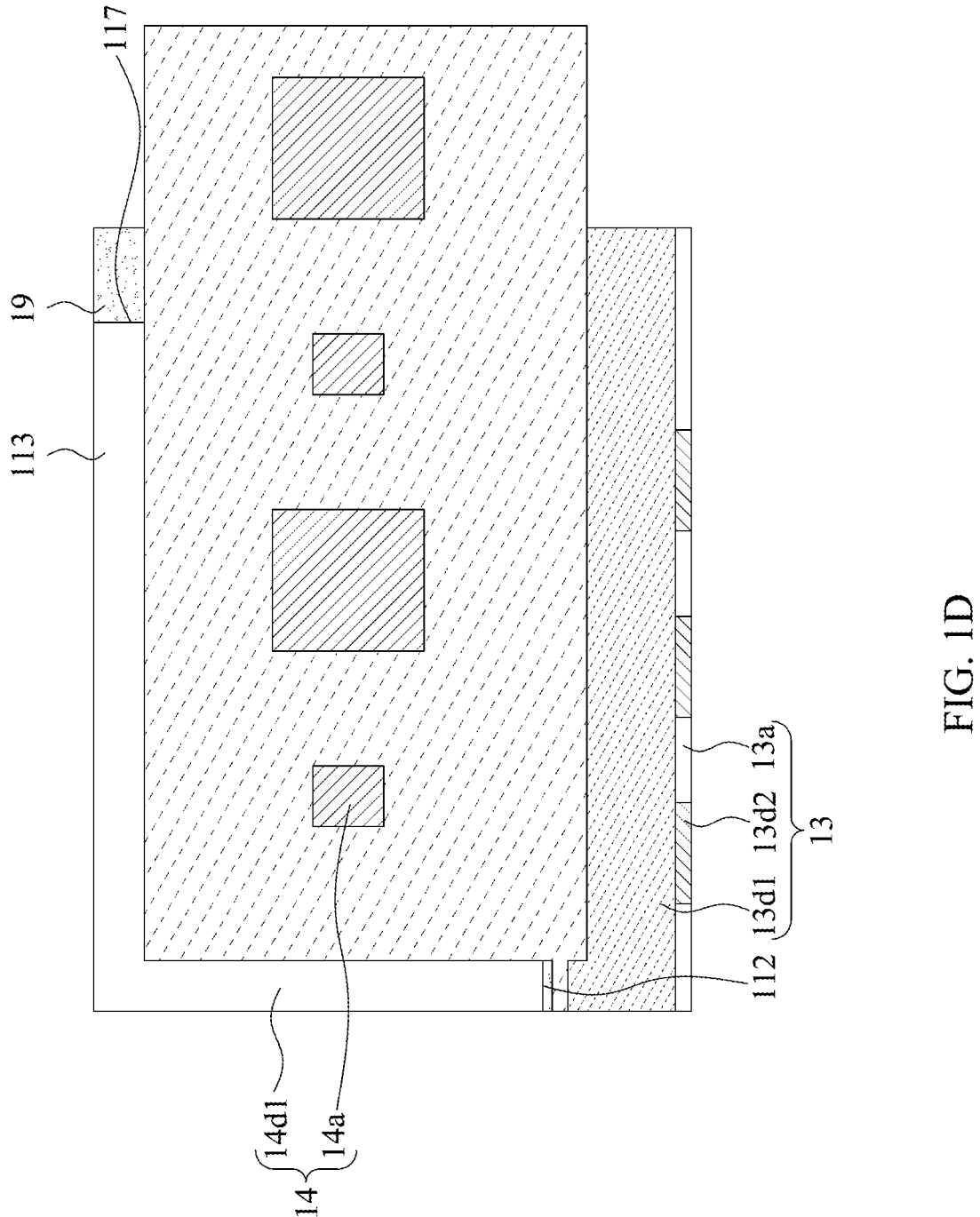
FIG. 1D is a cross-sectional view of a part of an electronic device, in accordance with an embodiment of the present disclosure.

FIG. 1D is a cross-sectional view of a part of the electronic device 1, in accordance with an embodiment of the present disclosure. The portion of the electronic device 1 in FIG. 1D is similar to the portion of the electronic device 1 in FIG. 1C, and the differences therebetween are described below.

The carrier 14d1 of the antenna component 14 extends out (or overhangs) of the surface 117.

For example, the carrier 14d1 of the antenna component 14 extends beyond the surface 117. For example, the carrier 14d1 of the antenna component 14 extends over the surface 117. For example, the carrier 14d1 of the antenna component 14 has an overhanging portion with respect to the surface 117.

In some embodiments, the carrier 14d1 of the antenna component 14 may extend out of a surface of the encapsulant 19. For example, the carrier 14d1 of the antenna component 14 extends beyond a surface of the encapsulant 19. For example, the carrier 14d1 of the antenna component 14 extends over a surface of the encapsulant 19. For example, the carrier 14d1 of the antenna component 14 has an overhanging portion with respect to a surface of the encapsulant 19.

In some embodiments, the conductive layer 14a (which may include an antenna array or an antenna pattern) of the antenna component 14 may be disposed on a portion of the carrier 14d1 of the antenna component 14 that extending out of a surface of the encapsulant 19.

In some embodiments, a surface area of the carrier 14d1 of the antenna component 14 may be greater than a surface area of the carrier 15d1 of the antenna component 15. In some embodiments, the antenna component 14 may have a frequency equal to or lower than a frequency of the antenna component 15.

Figure 2:
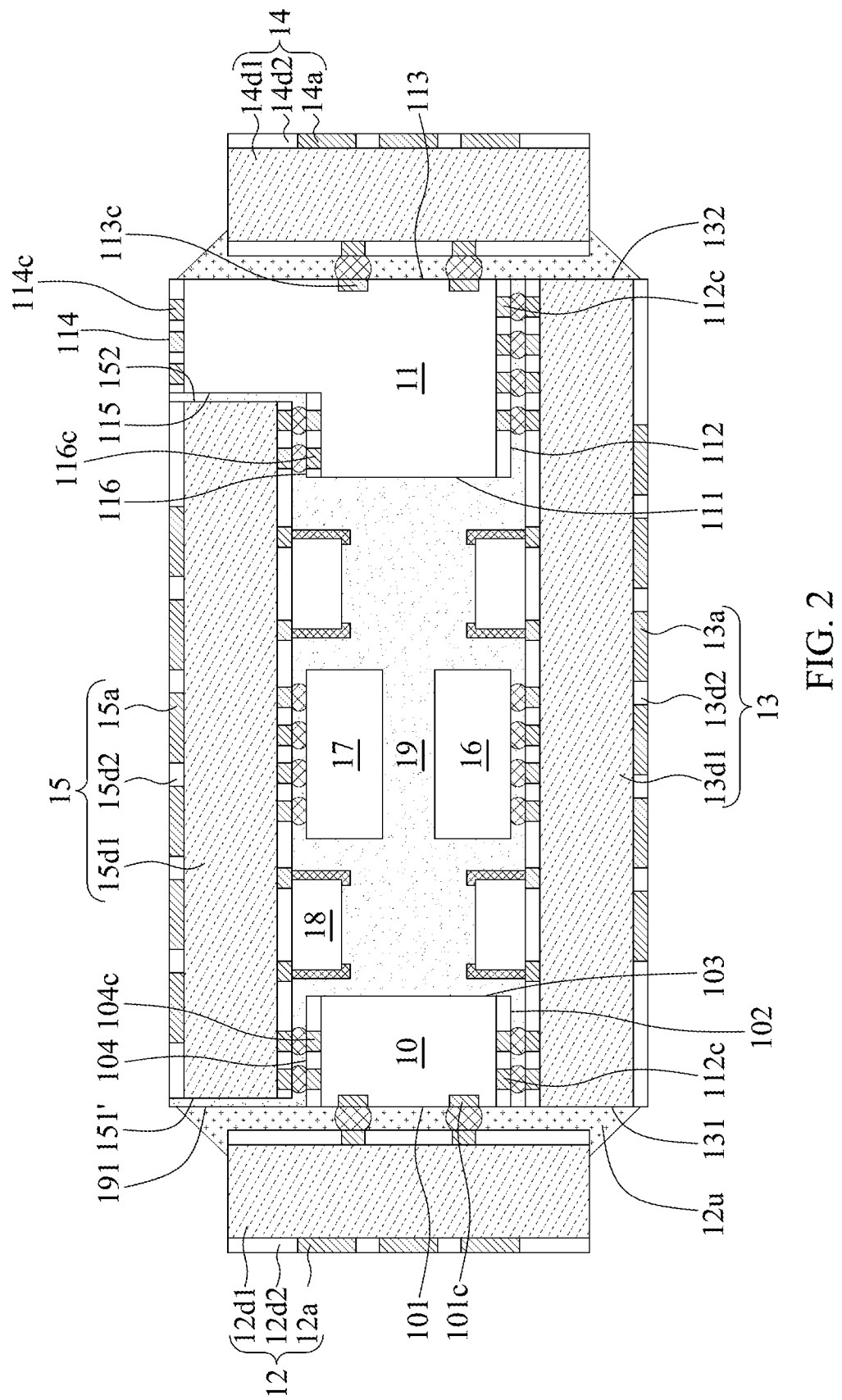
FIG. 2 is a cross-sectional view of an electronic device, in accordance with an embodiment of the present disclosure.

FIG. 2 is a cross-sectional view of an electronic device 2, in accordance with an embodiment of the present disclosure.

The electronic device 2 is similar to the electronic device 1 as shown in FIG. 1A, and the differences therebetween are described below.

Referring to FIG. 2, the encapsulant 19 of the electronic device 2 has a surface 191 substantially coplanar with the surface 101 of the connector 10. The encapsulant 19 may cover, encapsulate or surround the surface 151' of the antenna component 15.

Figure 3:
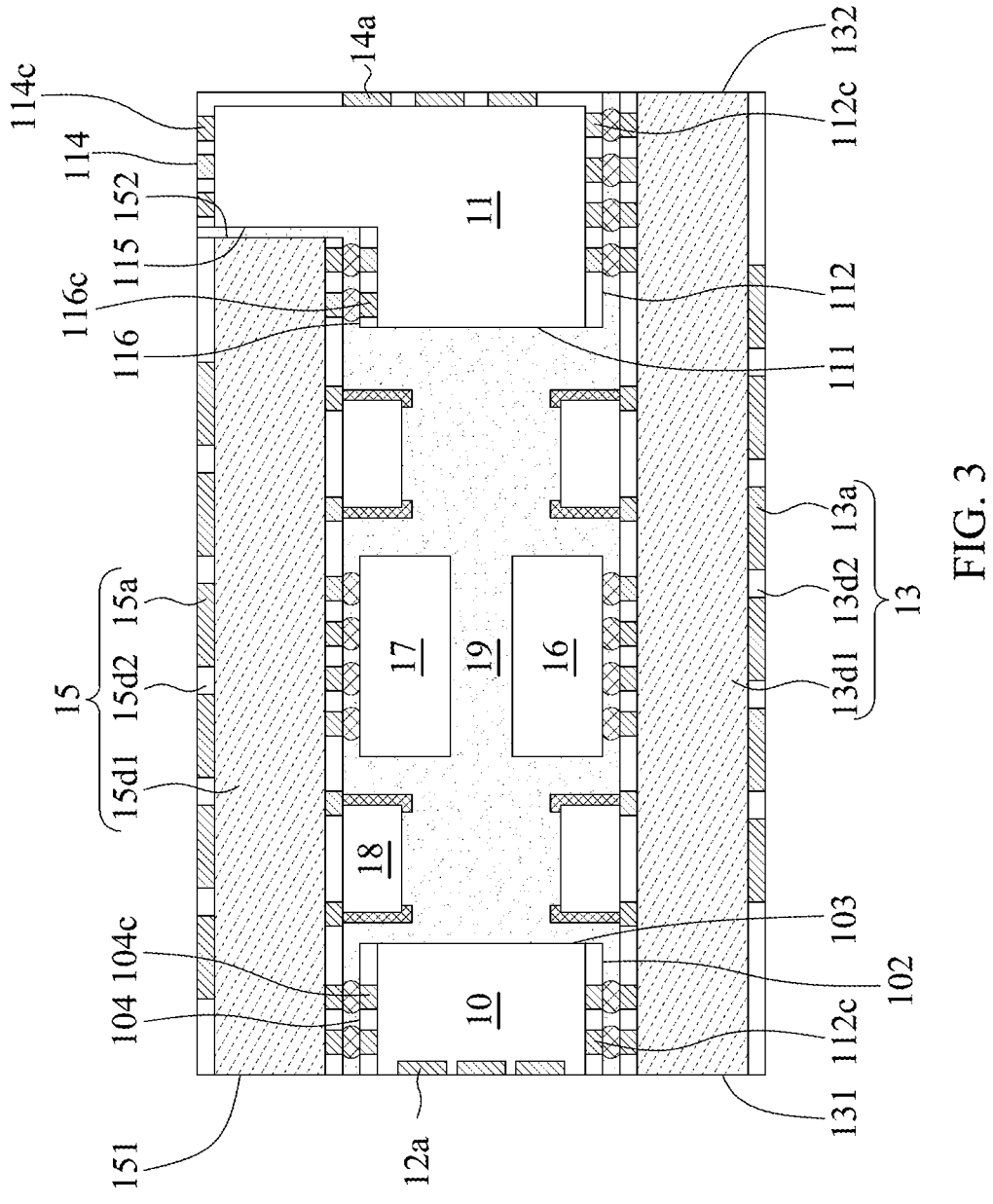
FIG. 3 is a cross-sectional view of an electronic device, in accordance with an embodiment of the present disclosure.

FIG. 3 is a cross-sectional view of an electronic device 3, in accordance with an embodiment of the present disclosure. The electronic device 3 is similar to the electronic device 1 as shown in FIG. 1A, and the differences therebetween are described below.

Referring to FIG. 3, the carriers 12*d*1 and 14*d*1 of the electronic device 1 are omitted. The conductive layer 12*a* is directly formed on the connector 10 and the conductive layer 14*a* is directly formed on the connector 11.

FIG. 4A, FIG. 4B, FIG. 4C, FIG. 4D, FIG. 4E, FIG. 4F, FIG. 4G, FIG. 4H, and FIG. 4I illustrate perspective views in one or more stages of a method of manufacturing an electronic device in accordance with an embodiment of the present disclosure. At least some of these figures have been simplified to better understand the aspects of the present disclosure. In some embodiments, the electronic device 1, the electronic device 2 and the electronic device 3 may be manufactured through the operations described with respect to FIG. 4A, FIG. 4B, FIG. 4C, FIG. 4D, FIG. 4E, FIG. 4F, FIG. 4G, FIG. 4H, and FIG. 4I.

Figure 4A:
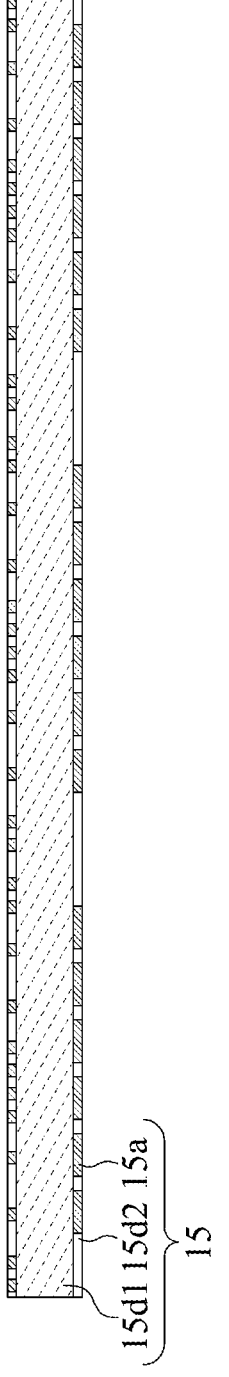
FIG. 4A, FIG. 4B, FIG. 4C, FIG. 4D, FIG. 4E, FIG. 4F, FIG. 4G, FIG. 4H, and FIG. 4I illustrate perspective views in one or more stages of a method of manufacturing an electronic device in accordance with an embodiment of the present disclosure.

Referring to FIG. 4A, the antenna component 15 is provided. The antenna component 15 includes the conductive layer 15*a*, the carrier 15*d*1 and the protection layer 15*d*2. The carrier 15*d*1 may include a copper clad laminate (CCL) substrate, which includes several carrier units that may be separable from one another by a scribe line (not shown in FIG. 4A).

Figure 4B:
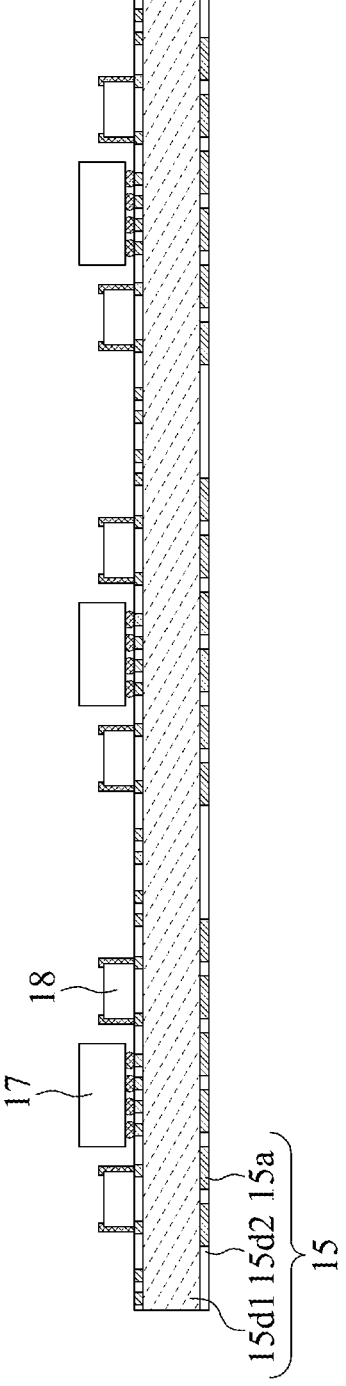

Referring to FIG. 4B, the electronic components 17 and 18 may be disposed on a surface of the carrier 15*d*1. The electronic components 17 and 18 may be disposed on an opposite side of the carrier 15*d*1 with respect to the conductive layer 15*a*.

Figure 4C:
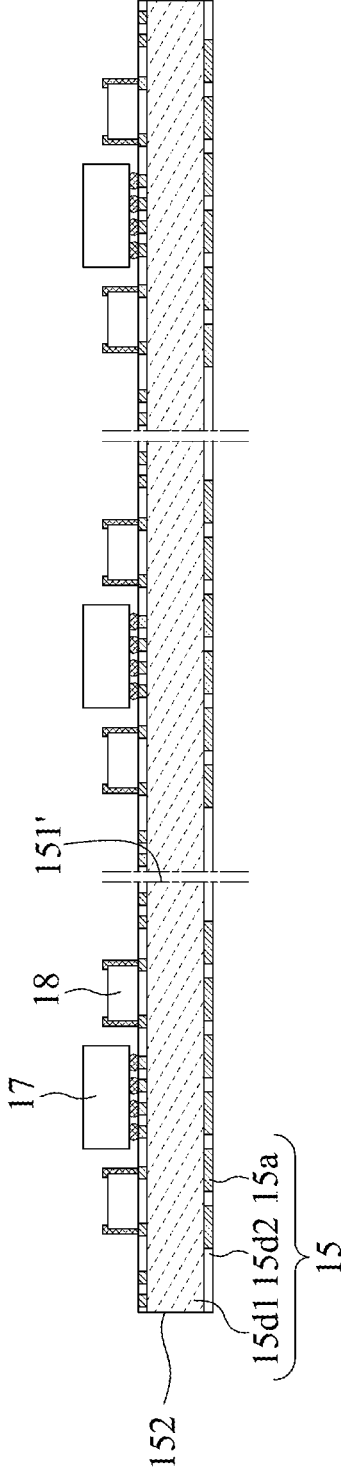

Referring to FIG. 4C, a singulation, cutting or sawing operation may be performed to form several carrier units, each including the conductive layer 15*a*, the carrier 15*d*1 and the protection layer 15*d*2. After the singulation, the surfaces 151' and 152 of the antenna component 15 is formed.

Figure 4D:
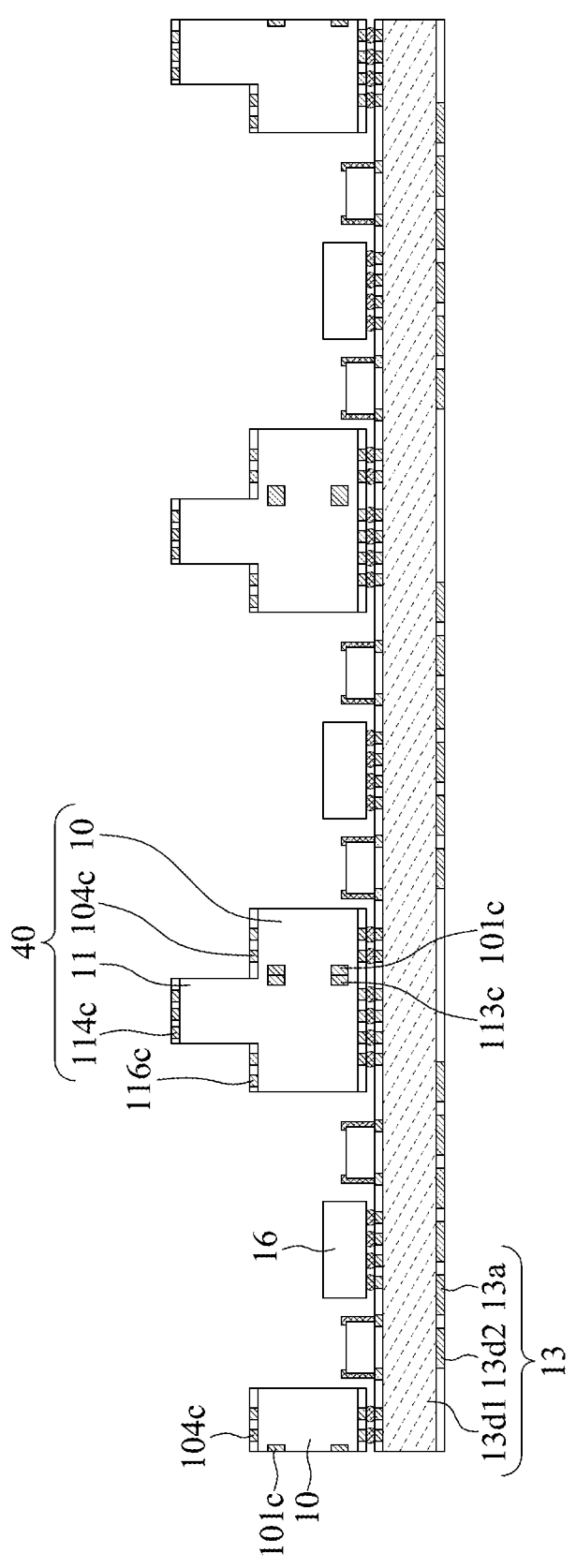

Referring to FIG. 4D, the antenna component 13 is provided. The antenna component 13 includes the conductive layer 13*a*, the carrier 13*d*1 and the protection layer 13*d*2. The carrier 13*d*1 may include a CCL substrate, which includes several carrier units that may be separable from one another by a scribe line (not shown in FIG. 4D).

The electronic component 16 may be disposed on a surface of the carrier 13*d*1. The electronic component 16 may be disposed on an opposite side of the carrier 13*d*1 with respect to the conductive layer 13*a*.

A connector 40 may be disposed on a surface of the carrier 13*d*1 and adjacent to the electronic component 16. The connector 40 may include the connector 10 and the connector 11. The connector 40 may include the conductive elements 101*c*, 104*c*, 113*c*, 114*c* and 116*c*. The conductive elements 101*c* and 113*c* may be disposed in the connector 40.

Figure 4E:
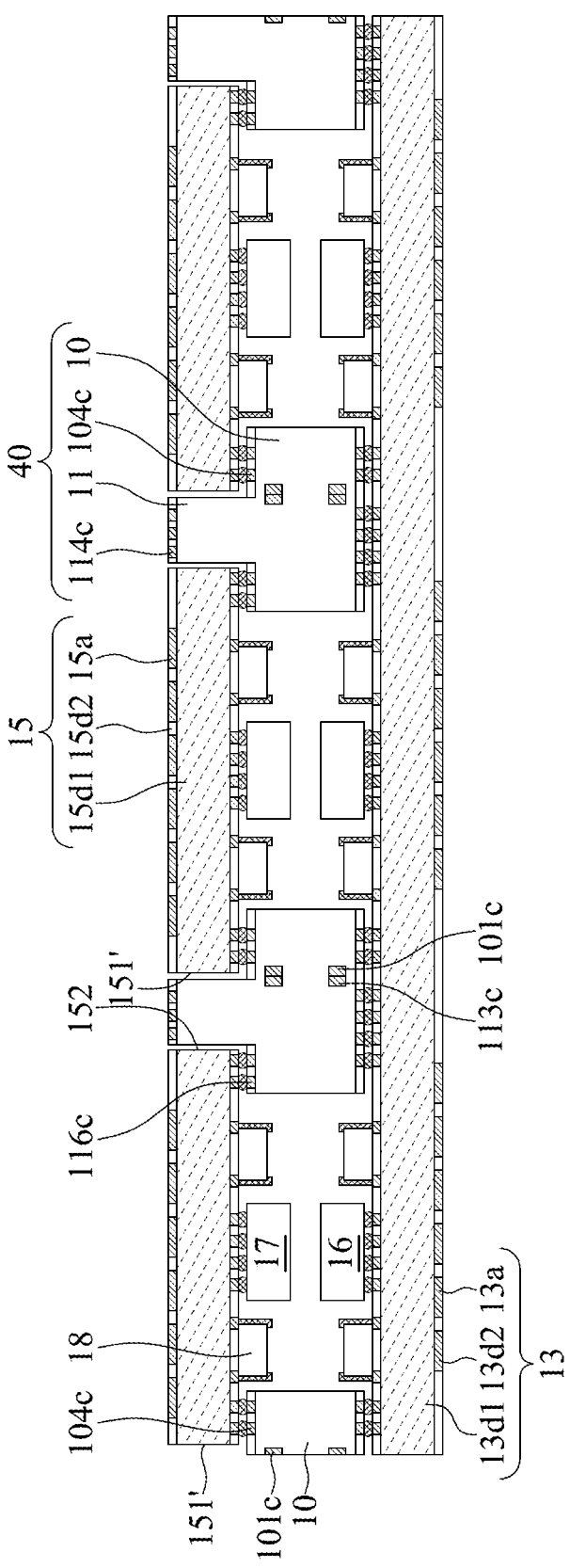

Referring to FIG. 4E, the antenna component 15 from the operation of FIG. 4C is disposed on the connector 40. The electronic component 17 is disposed between the electronic component 16 and the carrier 15*d*1. The antenna component 15 is electrically connected with the conductive elements 116*c* and 104*c*.

Figure 4F:
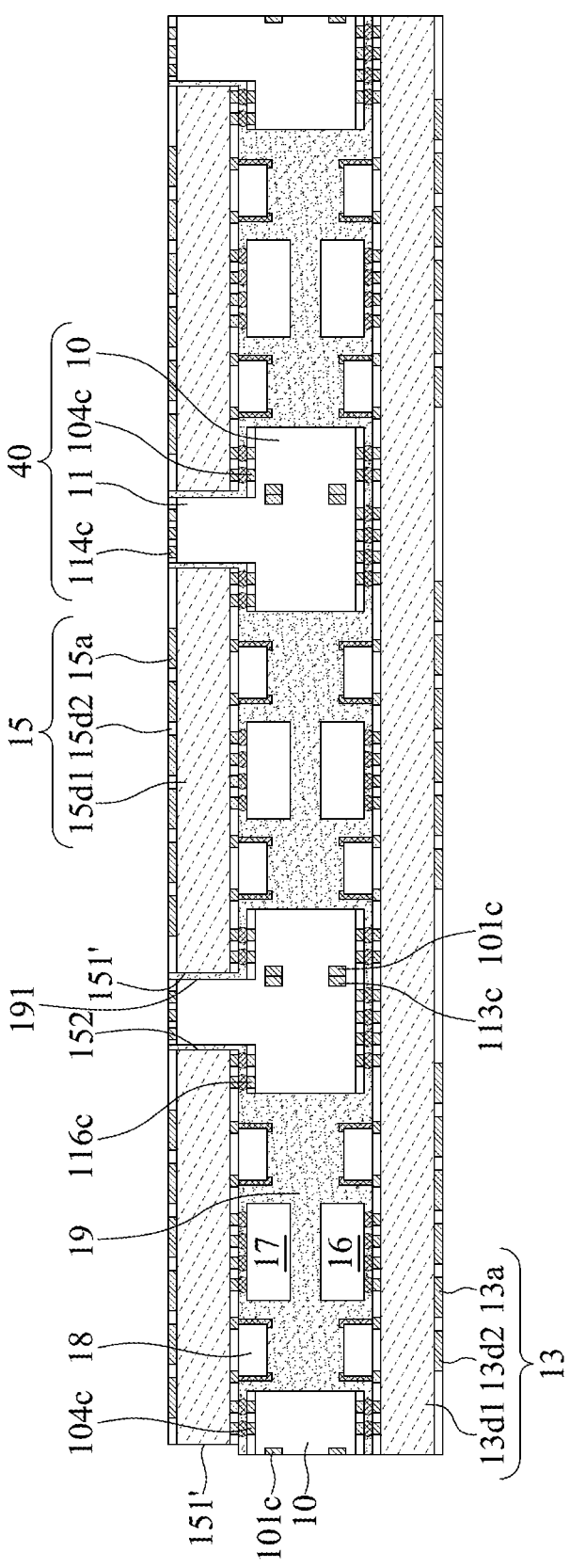

Referring to FIG. 4F, the encapsulant 19 is disposed between the antenna component 13 and the antenna component 15 to cover or encapsulate the electronic components 16, 17 and 18. In some embodiments, the encapsulant 19 may be formed by a molding technique, such as transfer molding or compression molding.

Figure 4G:
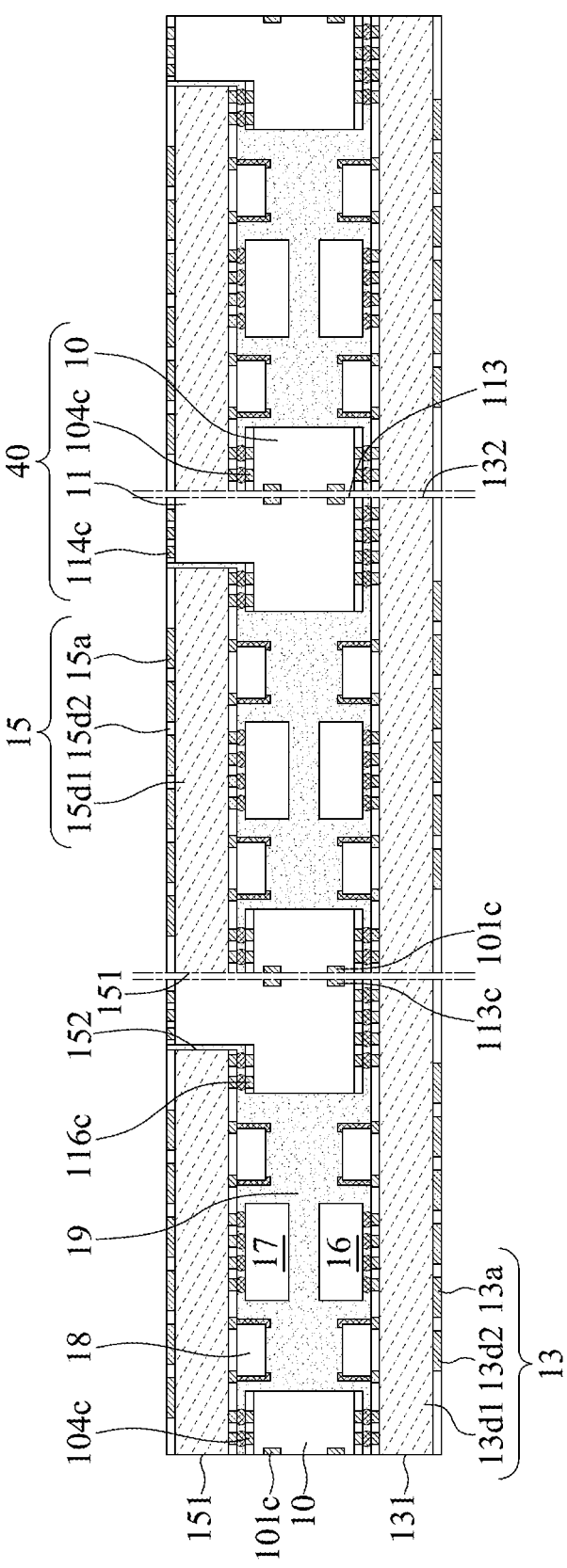

Referring to FIG. 4G, a singulation, cutting or sawing operation may be performed to form several carrier units. After the singulation, the surface 132 of the antenna component 13 and the surface 113 of the connector 11 are formed. The surface 132 of the antenna component 13 and the surface 113 of the connector 11 may be coplanar.

The antenna component 15 may also be singulated from the surface 151' of the antenna component 15 and the new surface 151 may be formed. Similarly, the surface 151 of the antenna component 15, the surface 131 of the antenna component 13 and the surface 101 of the connector 10 is formed. The surface 151 of the antenna component 15, the surface 131 of the antenna component 13 and the surface 101 of the connector 10 may be coplanar. In some embodiments, the singulation may not cut through the antenna component 15, and the encapsulant 19 may have a surface 191 coplanar to the surface 101 of the connector 10 as shown in FIG. 2. The encapsulant 19 may cover the surface 151' of the antenna component 15 as shown in FIG. 2.

The conductive elements 101*c* and 113*c* are exposed to provide electrical connection for disposing another antenna component.

Figure 4H:
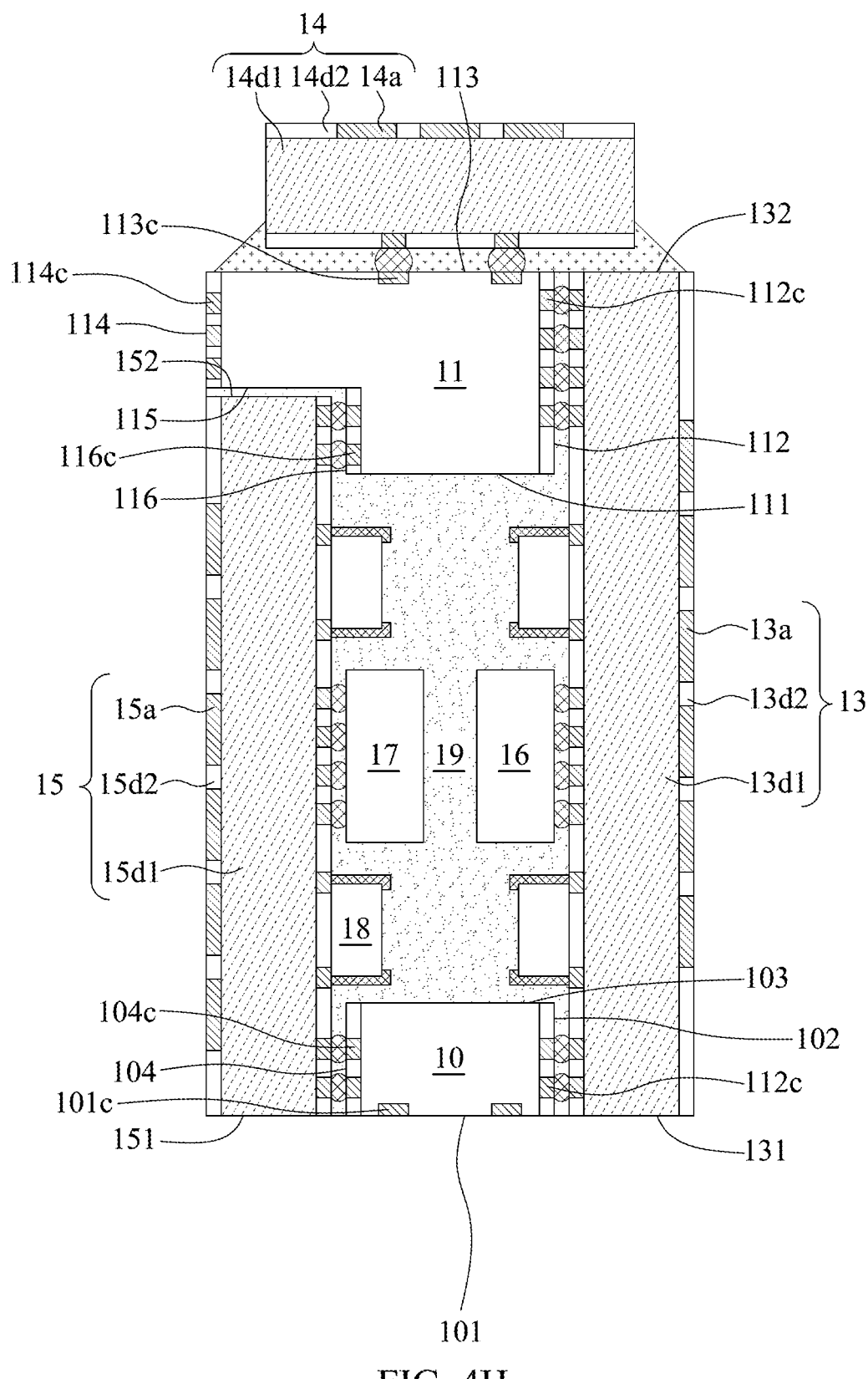

Referring to FIG. 4H, the antenna component 14 is disposed on the surface 113 of the connector 11. The antenna component 14 is electrically connected with the conductive elements 113*c*.

Figure 4I:
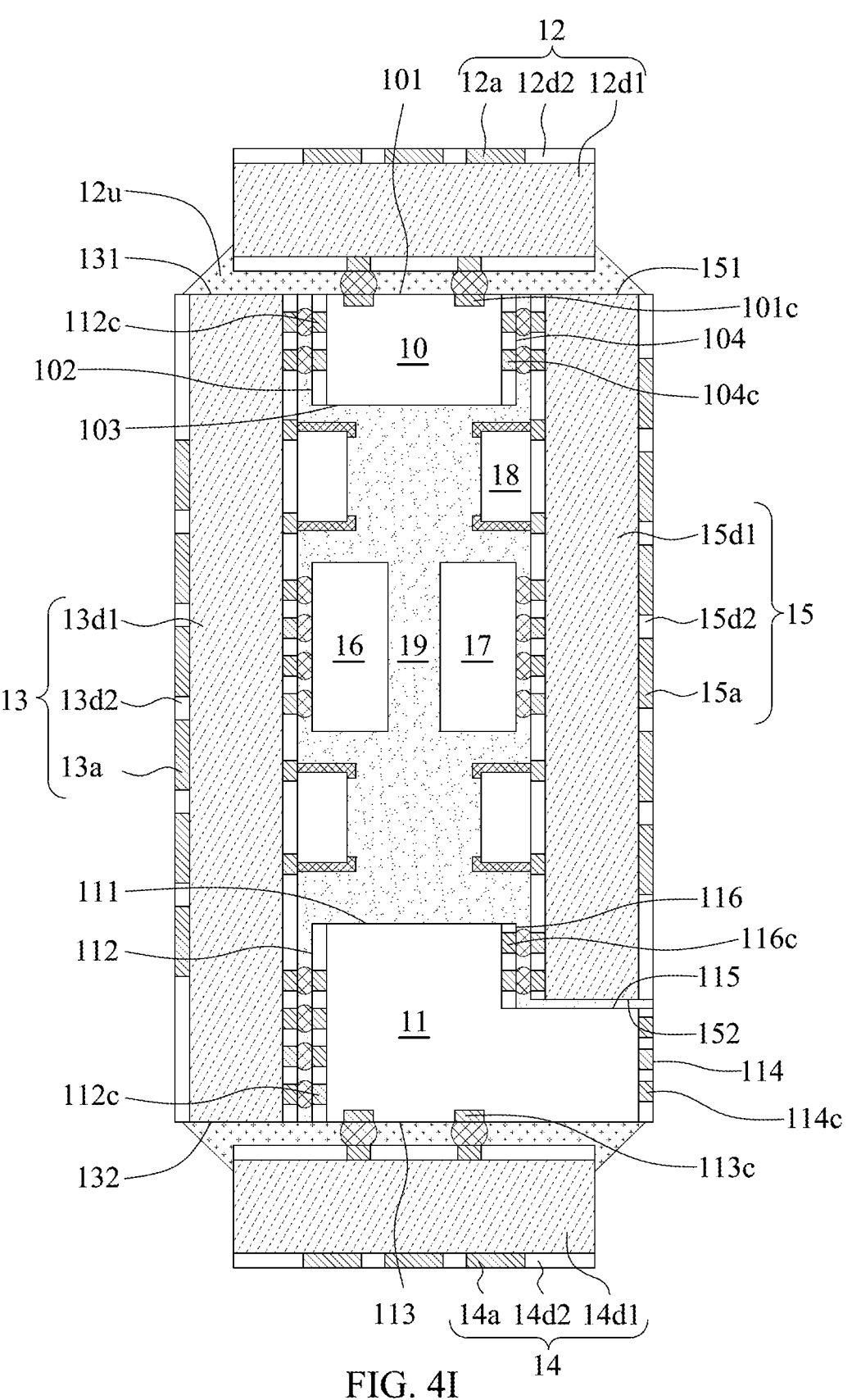

Referring to FIG. 4I, the antenna component 12 is disposed on the surface 101 of the connector 10. The antenna component 12 is electrically connected with the conductive elements 101*c*. The final structure may be similar to the electronic device 1 in FIG. 1A.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:
a first substrate having a first surface;
a second substrate disposed over the first surface of the first substrate, the second substrate having a first surface configured for providing an external electrical connection to outside the electronic device and a second surface distinct from the first surface of the second substrate; and a first antenna component disposed over the second surface of the second substrate and having a first surface facing the first substrate, wherein the second surface of the second substrate and the first antenna component are vertically overlapped in a first direction substantially perpendicular to the first surface of the first substrate,
wherein the first surface of the second substrate and the first antenna component are not vertically overlapped in the first direction;
a first integrated circuit (IC) device connected to the first surface of the first antenna component and horizontally overlapping the second substrate in a second direction substantially parallel with the first surface of the first substrate, wherein the first IC device is completely covered by the first antenna component in the first direction;
a third substrate connected to the first surface of the first substrate and the first surface of the first antenna component, wherein the third substrate has a surface facing and spaced apart from the second substrate;
an encapsulant contacting the first surface of the first substrate, the first surface of the first antenna component, and the surface of the third substrate; and
a second antenna component connected to the third substrate, wherein the second antenna component is horizontally overlapped with the first substrate, the second substrate, the third substrate, and the first antenna component in the second direction.

2. The electronic device of claim 1, wherein the second substrate has a third surface facing toward the first substrate and opposite to the first surface of the second substrate and the second surface of the second substrate, and wherein the first surface of the second substrate and the second surface of the second substrate are positioned at different elevations relative to the third surface of the second substrate.

3. The electronic device of claim 2, wherein the second substrate has a first lateral surface connecting the second surface of the second substrate and the third surface of the second substrate, a second lateral surface opposite to the first lateral surface, and a third lateral surface connecting the first surface of the second substrate and the second surface of the second substrate.

4. The electronic device of claim 3, wherein the encapsulant contacts the first lateral surface of the second substrate.

5. The electronic device of claim 3, further comprising:
a third antenna component connected to the second lateral surface of the second substrate, wherein the third antenna component is horizontally overlapped with the first substrate, the second substrate, the third substrate, the first antenna component, and the second antenna component in the second direction.

6. The electronic device of claim 5, wherein the third antenna component is electrically connected with the first antenna component through the second substrate.

7. The electronic device of claim 6, wherein the second antenna component is electrically connected with the first antenna component through the third substrate.

8. The electronic device of claim 1, further comprising:
an underfill disposed between the third substrate and the second antenna component, wherein the underfill partially covers the first substrate and the first antenna component.

9. The electronic device of claim 8, wherein the underfill contacts a portion of the encapsulant.

10. The electronic device of claim 1, further comprising:

a second IC device connected to the first surface of the first substrate and horizontally overlapping the second substrate in the second direction, wherein the first IC device and the second IC device are vertically over-lapped in the first direction and spaced apart from each other through the encapsulant.

11. The electronic device of claim 10, wherein the second IC device is electrically connected with the first IC device through the first substrate, the second substrate, and the first antenna component.

12. The electronic device of claim 1, wherein the first IC device is electrically connected with the first substrate through the first antenna component and the second sub-strate.

13. The electronic device of claim 1, wherein the first surface of the second substrate and the first IC device are positioned at different elevations relative to the first sub-strate.

14. The electronic device of claim 1, wherein the first antenna component includes a plurality of antennas on a second surface of the first antenna component opposite to the first surface of the first antenna component, and wherein larger antennas and smaller antennas in the plurality of antennas are arranged in a staggered manner along a third direction.

15. The electronic device of claim 14, wherein the third direction is substantially perpendicular to the first direction and the second direction.

16. The electronic device of claim 15, wherein the second substrate includes a plurality of conductive pads on the first surface of the second substrate, and wherein the plurality of conductive pads are arranged along the second direction.

17. The electronic device of claim 16, wherein the plu-rality of antennas and the plurality of conductive pads are positioned at a same elevation relative to the first substrate.

18. The electronic device of claim 17, wherein the first antenna component has a third surface spaced apart from the second substrate by the encapsulant.

19. The electronic device of claim 18, wherein a width of the first substrate measured along the second direction is greater than a width of the first antenna component mea-sured along the second direction.

20. The electronic device of claim 19, wherein the first antenna component has a fourth surface opposite to the third surface of the first antenna component and covered by an underfill.

\* \* \* \* \*